United States Patent
Parry et al.

(10) Patent No.: US 10,783,303 B2
(45) Date of Patent: Sep. 22, 2020

(54) THERMAL MODEL OBFUSCATION

(71) Applicant: Mentor Graphics Corporation, Wilsonville, OR (US)

(72) Inventors: John Parry, Horsham (GB); Robin Bornoff, Herefordshire (GB); John Richard Wilson, Sunnyvale, CA (US)

(73) Assignee: Mentor Graphics Corporation, Wilsonville, OR (US)

( * ) Notice: Subject to any disclaimer, the term of this patent is extended or adjusted under 35 U.S.C. 154(b) by 98 days.

(21) Appl. No.: 16/000,888

(22) Filed: Jun. 6, 2018

(65) Prior Publication Data
US 2018/0349523 A1 Dec. 6, 2018

Related U.S. Application Data

(60) Provisional application No. 62/515,633, filed on Jun. 6, 2017.

(51) Int. Cl.
*G06F 30/30* (2020.01)
*G06F 30/3323* (2020.01)
*G06F 30/367* (2020.01)

(52) U.S. Cl.
CPC ........ *G06F 30/3323* (2020.01); *G06F 30/367* (2020.01)

(58) Field of Classification Search
CPC .......................... G06F 17/5036; G06F 17/504
USPC ................................................ 716/100, 106
See application file for complete search history.

(56) References Cited

U.S. PATENT DOCUMENTS

| | | | | |
|---|---|---|---|---|
| 4,547,826 A | * | 10/1985 | Premerlani | H02H 6/005 361/103 |
| 4,573,132 A | * | 2/1986 | Boothman | H02H 6/005 318/472 |
| 5,436,784 A | * | 7/1995 | Schweitzer | H02H 6/00 361/103 |
| 7,194,711 B2 | * | 3/2007 | Chandra | G06F 17/5036 716/111 |
| 7,421,586 B2 | * | 9/2008 | Luo et al. | G06F 21/125 713/164 |
| 7,587,616 B2 | * | 9/2009 | Jakubowski | G06F 8/51 713/189 |
| 7,689,969 B1 | * | 3/2010 | Wendling | G06F 8/34 713/189 |
| 8,620,235 B2 | * | 12/2013 | Riddle et al. | G06F 1/206 455/117 |
| 8,719,716 B2 | * | 5/2014 | Wendling | G06F 8/34 715/763 |
| 8,832,646 B1 | * | 9/2014 | Wendling | G06F 8/34 717/105 |
| 8,897,979 B2 | * | 11/2014 | Hebbale et al. | F16D 48/06 701/67 |
| 9,582,621 B2 | * | 2/2017 | Anderson et al. | G06F 17/5036 |
| 9,583,471 B2 | * | 2/2017 | Teeter et al. | H01L 25/18 |
| 10,262,127 B2 | * | 4/2019 | Subramaniyan et al. | G06F 21/10 |

(Continued)

*Primary Examiner* — Sun J Lin

(57) ABSTRACT

Various aspects of a technology disclosed herein relate to thermal model obfuscation. A thermal model for a first assembly is received. An obfuscated thermal model is then generated from the thermal model. The generation comprises replacing name or names associated with one or more objects in the first assembly with obfuscated names. The obfuscated thermal model can be used in a thermal simulation of a second assembly, of which the first assembly is a component.

17 Claims, 3 Drawing Sheets

Flow chart 300

(56) References Cited

U.S. PATENT DOCUMENTS

| | | | |
|---|---|---|---|
| 10,409,358 B1* | 9/2019 | Yaddanapudi et al. | ........................ G06F 17/5036 |
| 2008/0191729 A1* | 8/2008 | Blanco | ............... G01R 31/2874 324/750.08 |
| 2010/0131518 A1* | 5/2010 | Elteto et al. | ........ G06F 21/6227 707/752 |
| 2017/0102681 A1* | 4/2017 | Verhoeven et al. | ... G05B 17/02 |

* cited by examiner

Flow chart 300

THERMAL MODEL OBFUSCATION

RELATED APPLICATIONS

This application claims the benefit of U.S. Provisional Patent Application No. 62/515,633, filed on Jun. 6, 2017, titled "Thermal Model Obfuscation," and naming John Parry et al. as inventors, which application is incorporated entirely herein by reference.

FIELD OF THE DISCLOSED TECHNIQUES

The presently disclosed techniques relates to thermal simulation aspects of product design. Various implementations of the disclosed techniques may be particularly useful for securing proprietary information contained in thermal models without affecting thermal simulation results.

BACKGROUND OF THE DISCLOSED TECHNIQUES

High operating temperatures can severely affect the performance, power consumption and reliability of a circuit system. With the continued scaling of integrated circuit technologies, high power density and the resulting difficulties in managing temperatures have become a major challenge for designers at all design levels. Computer modeling tools have been employed to predict and simulate the thermal behavior of both physical and virtual structures.

An electronic assembly typically contains subassemblies. For example, a circuit card assembly may have several chip packages (integrated circuit packages, IC packages) on it. The chip packages are often supplied by third-party chip manufacturers. Along with the chip packages, the third-party chip manufacturers may also provide thermal models of the chip packages to the circuit board designers for thermal simulation purposes. A thermal model of a chip package can contain information of the particular integrated circuit being used, object names that give information about the supplier or material used, e.g. "Kovar lid", attribute names that give information about the material or surface finish used, the geometry itself (i.e. sizes and locations of objects), the values of thermal properties associated with the material (density, specific heat capacity and thermal conductivity), and surface attributes (material roughness, emissivity). Some information contained in the thermal model such as information of bonding materials, glues, die attach materials, and plastic encapsulates is commercially sensitive. The supply of thermal models for use further along the supply chain is thus quite restricted.

Any proprietary information contained in the thermal model may be manually removed, but this process is error prone. Another approach is to transform the thermal model into a locked assembly or a black box model. This can be achieved by making the proprietary information neither accessible nor visible to the user. Due to the inaccessibility, however, the user cannot change the data. Changing the data is needed sometimes in thermal simulation. For example, a power value may need to be assigned to an object representing the die within the package or the value of any pre-assigned heat source that may have been set by the supplier of the model may need to be changed. Such a heat source is not an attribute of the package, but rather how it is used (e.g. a CPU that is idle vs. one that is running at full power processing many tasks).

Compact thermal models may be used to prevent the proprietary information from being disclosed. A compact thermal model is a behavioral model that aims to accurately predict the temperature of the package only at a few critical points such as junction, case, and leads. It is an abstraction of the response of a component to the environment it is placed in, but it is not constructed by trying to mimic the geometry and material properties of the actual component. Therefore, a compact thermal model cannot provide the same prediction accuracy as a thermal model.

BRIEF SUMMARY OF THE DISCLOSED TECHNIQUES

Various aspects of the disclosed technology relate to thermal model obfuscation. In one aspect, there is a method, executed by at least one processor of a computer, comprising: receiving a thermal model for a first assembly; generating an obfuscated thermal model from the thermal model, wherein the generating comprises: replacing names associated with one or more objects in the assembly with obfuscated names; and storing the obfuscated thermal model for being used in thermal simulation of a second assembly, of which the first assembly is a component.

The method may further comprise: performing a thermal simulation on the second assemble based on the obfuscated thermal model. Alternatively or additionally, the method may further comprise: storing information of the thermal model and information of the obfuscated thermal model in a cross-referenced way.

The generating may further comprise: varying one or more parameters in the first thermal model within a predetermined range, varying two or more parameters in the first thermal model such that the effects on thermal properties are cancelled out, removing annotations in the thermal model, or any combination thereof.

In another aspect, there are one or more non-transitory computer-readable media storing computer-executable instructions for causing one or more processors to perform the above method.

In still another aspect, there is a system, comprising: one or more processors, the one or more processors programmed to perform the above method.

Certain inventive aspects are set out in the accompanying independent and dependent claims. Features from the dependent claims may be combined with features of the independent claims and with features of other dependent claims as appropriate and not merely as explicitly set out in the claims.

Certain objects and advantages of various inventive aspects have been described herein above. Of course, it is to be understood that not necessarily all such objects or advantages may be achieved in accordance with any particular embodiment of the disclosed techniques. Thus, for example, those skilled in the art will recognize that the disclose techniques may be embodied or carried out in a manner that achieves or optimizes one advantage or group of advantages as taught herein without necessarily achieving other objects or advantages as may be taught or suggested herein.

DETAILED DESCRIPTION OF THE DISCLOSED TECHNIQUES

General Considerations

Various aspects of the disclosed technology relate to thermal model obfuscation. In the following description, numerous details are set forth for the purpose of explanation. However, one of ordinary skill in the art will realize that the disclosed technology may be practiced without the use of these specific details. In other instances, well-known features have not been described in details to avoid obscuring the disclosed technology.

Some of the techniques described herein can be implemented in software instructions stored on a computer-readable medium, software instructions executed on a computer, or some combination of both. Some of the disclosed techniques, for example, can be implemented as part of a thermal modeling tool. Such methods can be executed on a single computer or on networked computers.

Although the operations of the disclosed methods are described in a particular sequential order for convenient presentation, it should be understood that this manner of description encompasses rearrangements, unless a particular ordering is required by specific language set forth below. For example, operations described sequentially may in some cases be rearranged or performed concurrently. Moreover, for the sake of simplicity, the disclosed flow charts and block diagrams typically do not show the various ways in which particular methods can be used in conjunction with other methods.

The detailed description of a method or a device sometimes uses terms like "generate" and "replace" to describe the disclosed method or the device function/structure. Such terms are high-level descriptions. The actual operations or functions/structures that correspond to these terms will vary depending on the particular implementation and are readily discernible by one of ordinary skill in the art.

Illustrative Operating Environment

Figure 1:
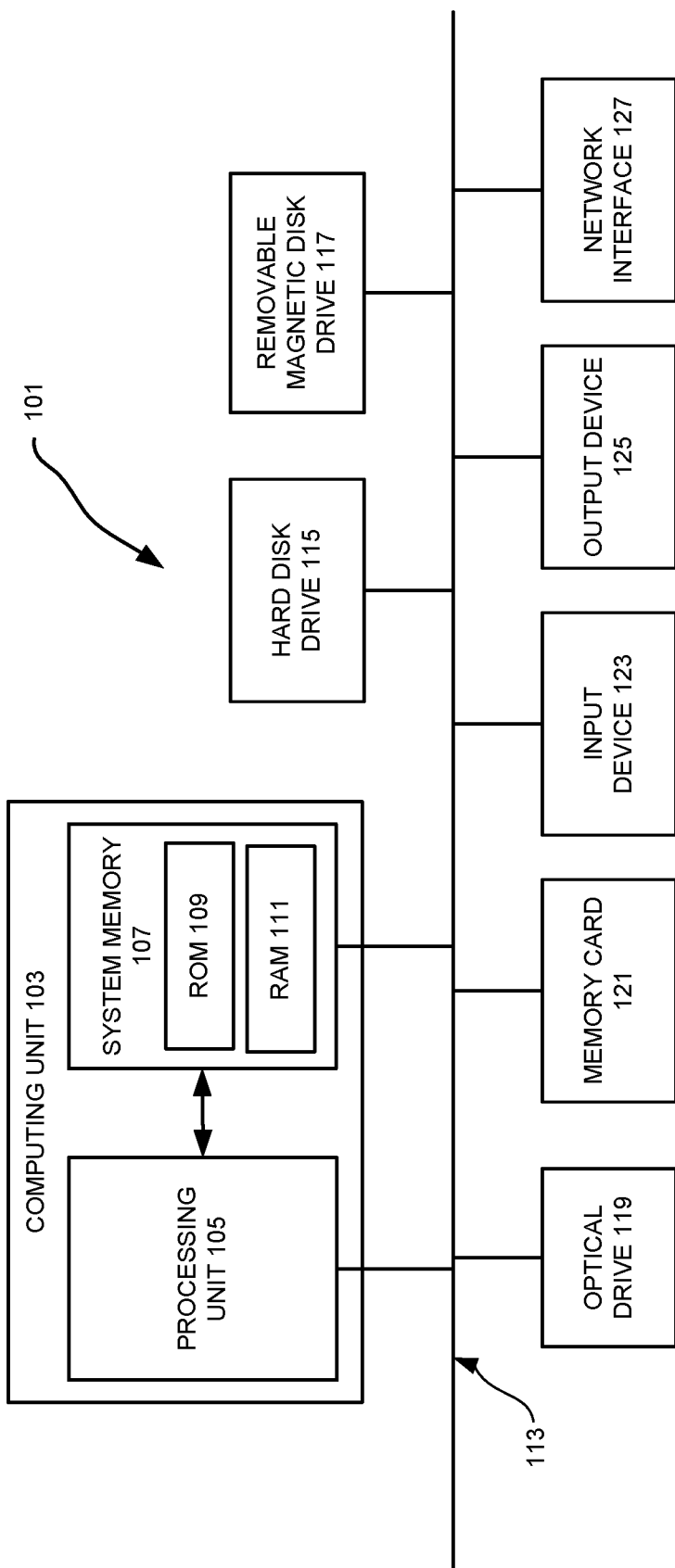
FIG. 1 illustrates a programmable computer system with which various embodiments of the disclosed technology may be employed.

Various examples of the disclosed technology may be implemented through the execution of software instructions by a computing device, such as a programmable computer. Accordingly, FIG. 1 shows an illustrative example of a computing device 101. As seen in this figure, the computing device 101 includes a computing unit 103 with a processing unit 105 and a system memory 107. The processing unit 105 may be any type of programmable electronic device for executing software instructions, but it will conventionally be a microprocessor. The system memory 107 may include both a read-only memory (ROM) 109 and a random access memory (RAM) 111. As will be appreciated by those of ordinary skill in the art, both the read-only memory (ROM) 109 and the random access memory (RAM) 111 may store software instructions for execution by the processing unit 105.

The processing unit 105 and the system memory 107 are connected, either directly or indirectly, through a bus 113 or alternate communication structure, to one or more peripheral devices. For example, the processing unit 105 or the system memory 107 may be directly or indirectly connected to one or more additional memory storage devices, such as a "hard" magnetic disk drive 115, a removable magnetic disk drive 117, an optical disk drive 119, or a flash memory card 121. The processing unit 105 and the system memory 107 also may be directly or indirectly connected to one or more input devices 123 and one or more output devices 125. The input devices 123 may include, for example, a keyboard, a pointing device (such as a mouse, touchpad, stylus, trackball, or joystick), a scanner, a camera, and a microphone. The output devices 125 may include, for example, a monitor display, a printer and speakers. With various examples of the computer 101, one or more of the peripheral devices 115-125 may be internally housed with the computing unit 103. Alternately, one or more of the peripheral devices 115-125 may be external to the housing for the computing unit 103 and connected to the bus 113 through, for example, a Universal Serial Bus (USB) connection.

With some implementations, the computing unit 103 may be directly or indirectly connected to one or more network interfaces 127 for communicating with other devices making up a network. The network interface 127 translates data and control signals from the computing unit 103 into network messages according to one or more communication protocols, such as the transmission control protocol (TCP) and the Internet protocol (IP). Also, the interface 127 may employ any suitable connection agent (or combination of agents) for connecting to a network, including, for example, a wireless transceiver, a modem, or an Ethernet connection. Such network interfaces and protocols are well known in the art, and thus will not be discussed here in more detail.

It should be appreciated that the computer 101 is illustrated as an example only, and it is not intended to be limiting. Various embodiments of the disclosed technology may be implemented using one or more computing devices that include the components of the computer 101 illustrated in FIG. 1, which include only a subset of the components illustrated in FIG. 1, or which include an alternate combination of components, including components that are not shown in FIG. 1. For example, various embodiments of the disclosed technology may be implemented using a multiprocessor computer, a plurality of single and/or multiprocessor computers arranged into a network, or some combination of both.

Thermal Model Obfuscation Tool

Figure 2:
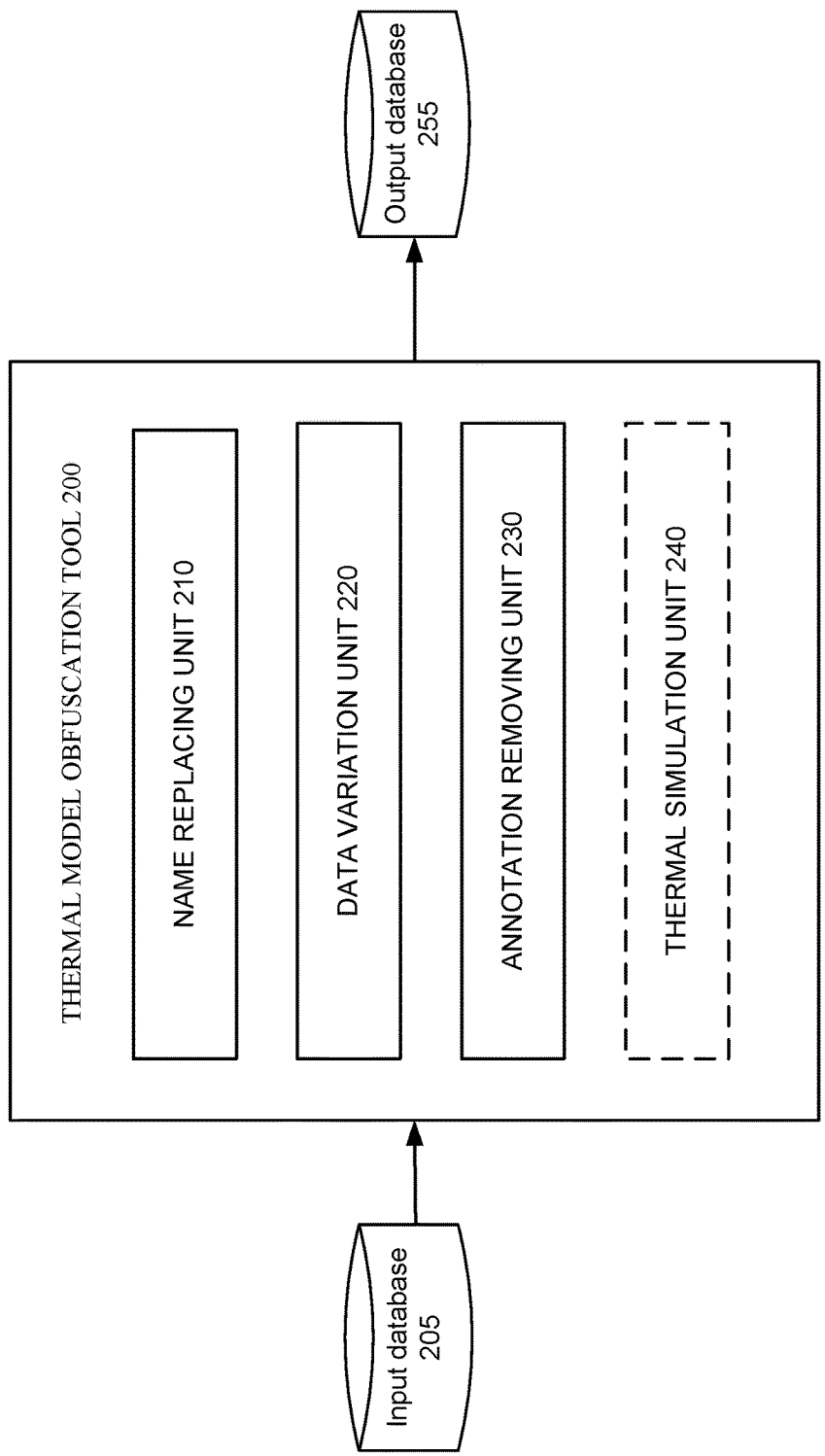
FIG. 2 illustrates a thermal model obfuscation tool according to various embodiments of the disclosed technology

FIG. 2 illustrates an example of a thermal model obfuscation tool 200 that may be implemented according to various embodiments of the disclosed technology. As seen in this figure, the thermal model obfuscation tool 200 includes a name changing unit 210, a data variation unit 220, and an annotation removing unit 230. Some implementations of the thermal model obfuscation tool 200 may cooperate with (or incorporate) one or more of a thermal simulation unit 240, an input database 205, and an output database 255.

As will be discussed in more detail below, the thermal model obfuscation tool 200 receives a thermal model for a first assembly from the input database 205. The name changing unit 210 replaces names associated with one or more objects in the assembly with obfuscated names. The annotation removing unit 230 removes notes attached to objects, materials, surface attributes from the thermal model. The data variation unit 220 can vary one or more parameters in the thermal model within a predetermined range, vary two or more parameters in the thermal model such that the effects on thermal properties are cancelled out, or both. The thermal model obfuscation tool 200 stores, in the output database 255, the generated obfuscated thermal model for being used in thermal simulation of a second assembly, of which the first assembly is a component. The thermal simulation unit 240 can perform a thermal simulation on the second assemble based on the obfuscated thermal model.

As previously noted, various examples of the disclosed technology may be implemented by one or more computing systems, such as the computing system illustrated in FIG. 1. Accordingly, one or more of the name changing unit 210, the data variation unit 220, the annotation removing unit 230, and the thermal simulation unit 240 may be implemented by executing programming instructions on one or more processors in one or more computing systems, such as the computing system illustrated in FIG. 1. Correspondingly, some other embodiments of the disclosed technology may be implemented by software instructions, stored on a non-transitory computer-readable medium, for instructing one or more programmable computers/computer systems to perform the functions of one or more of the name changing unit 210, the data variation unit 220, the annotation removing unit 230, and the thermal simulation unit 240. As used herein, the term "non-transitory computer-readable medium" refers to computer-readable medium that are capable of storing data for future retrieval and not propagating electro-magnetic waves. The non-transitory computer-readable medium may be, for example, a magnetic storage device, an optical storage device, or a solid state storage device.

It also should be appreciated that, while the name changing unit 210, the data variation unit 220, the annotation removing unit 230, and the thermal simulation unit 240 are shown as separate units in FIG. 2, a single computer (or a single processor within a master computer) or a single computer system may be used to implement all of these units at different times, or components of these units at different times.

With various examples of the disclosed technology, the input database 205 and the output database 255 may be implemented using any suitable computer readable storage device. That is, either of the input database 205 and the output database 255 may be implemented using any combination of computer readable storage devices including, for example, microcircuit memory devices such as read-write memory (RAM), read-only memory (ROM), electronically erasable and programmable read-only memory (EEPROM) or flash memory microcircuit devices, CD-ROM disks, digital video disks (DVD), or other optical storage devices. The computer readable storage devices may also include magnetic cassettes, magnetic tapes, magnetic disks or other magnetic storage devices, holographic storage devices, or any other non-transitory storage medium that can be used to store desired information. While the input database 205 and the output database 255 are shown as separate units in FIG. 2, a single data storage medium may be used to implement some or all of these databases.

Thermal Model Obfuscation

Figure 3:
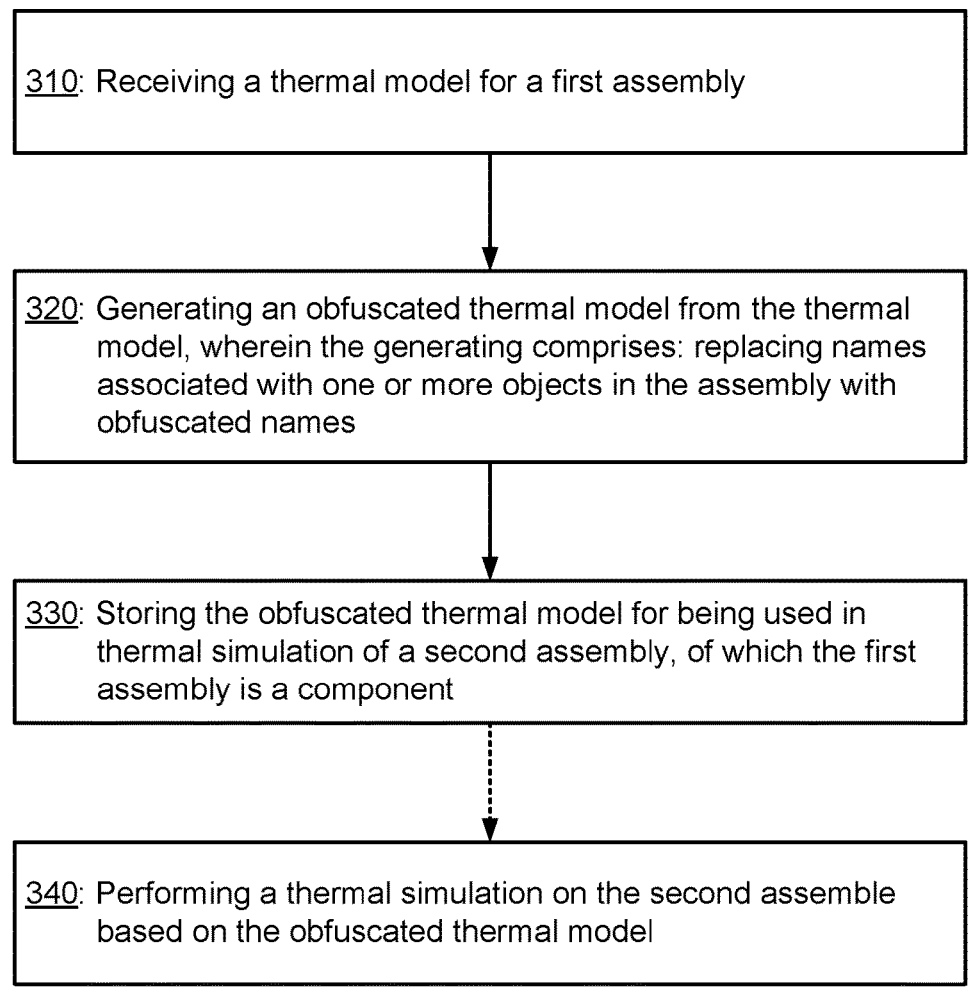
FIG. 3 illustrates a flowchart showing a process of thermal model obfuscation that may be implemented according to various examples of the disclosed technology.
Figure 3:

FIG. 3 illustrates a flowchart 300 showing a process of thermal model obfuscation that may be implemented according to various examples of the disclosed technology. For ease of understanding, methods of thermal model obfuscation that may be employed according to various embodiments of the disclosed technology will be described with reference to the thermal model obfuscation tool 200 illustrated in FIG. 2 and the flow chart 300 in FIG. 3. It should be appreciated, however, that alternate implementations of a thermal model obfuscation tool 200 may be used to perform the method of thermal model obfuscation in the flow chart 300 according to various embodiments of the disclosed technology. In addition, it should be appreciated that implementations of the thermal model obfuscation tool 200 may be employed to implement methods of thermal model obfuscation according to different embodiments of the disclosed technology other than the one illustrated by the flow chart 300 in FIG. 3.

In operation 310, the thermal model obfuscation tool 200 receives a thermal model for a first assembly. A thermal model attempts to represent or reconstruct the physical geometry of an assembly. It can predict the temperature at various points within the assembly including, e.g. junction, case, and leads under various environment conditions. The first assembly may be a chip package. The thermal model of the chip package often contains information of the particular integrated circuit being used, object names that give information about the supplier or material used, e.g. "Kovar lid", attribute names that give information about the material or surface finish used, the geometry itself (i.e. sizes and locations of objects), the values of thermal properties associated with the material (density, specific heat capacity and thermal conductivity), and surface attributes (material roughness, emissivity).

In operation 320, the thermal model obfuscation tool 200 generates an obfuscated thermal model from the thermal model. The operation comprises using the name changing unit 210 to replace names associated with one or more objects in the assembly with obfuscated names. The original names may contain descriptive information. The obfuscated names may be numerical, alphabetical, alphanumerical, or string which may also contain special characters. They may be unique, or could be common, with the same string used for many or all objects, materials, etc. within the model. Table 1 provides some examples which may be employed in various embodiments of the disclosed technology.

TABLE 1

| Description of object or Assembly in model | Object name in original model | Example of obfuscated name | Obfuscation |
|---|---|---|---|
| Die attach glue layer | Glue die attach | 9a404a5c-dc86-4291-b7fc-60c6b304cd81 | Randomly generated alphanumeric string with a special character (—) |
| Chassis cooling fan | EBM-Papst 5214NM | AX-FAN00000001 | Anonymized name retaining information of the type of object (axial fan) with a counter (00000001) to make the name unique |
| Cuboid representing a dielectric layer in a PCB | Motherboard Layer 3 | CUBOID00000009 | As above. |

It should be noted that some simulation tools may require an object to have a unique name within the project, or within a particular assembly, influencing the choice of obfuscation.

The operation 320 may also comprise using the annotation removing unit 230 to remove any notes attached to objects, materials, surface attributes from the thermal model as these may contain sensitive proprietary information.

The operation 320 may further comprise using the data variation unit 220 to change material properties or to vary one or more parameters in the first thermal model within a predetermined range. If the same material is attached to multiple objects, e.g. an array of solder balls all being the same solder material, the single material attached to all solder balls can be replicated such that an each solder ball has its own material, each with its own obfuscated name.

However, the material property values of which are common to all solder balls. Various materials have quite recognizable properties such as copper for example. To prevent the obfuscated model being searched to determine for example, what material corresponds to say pure copper in the model, by searching for a thermal conductivity of 386 W/mK, the value could be slightly adjusted. For example, if there are 100 objects in the original model that have a single material attached to them having the material properties of copper, in addition to creating 100 instances of this material, all with unique obfuscated names, the value of 386 W/mK for the thermal conductivity, and correspondingly the values for the density and specific heat capacity could be changed by randomly adding or subtracting a random amount within the range of +1% of the original value. For the thermal conductivity of copper, this change could be k=386.0±3.86*RAND. Here, where RAND is a function that returns a random number between 0 and 1. This would have a minor impact on the results obtained, but well within the modeling accuracy. Hence if someone were to attempt to determine if copper is attached to any material by searching the model for 386.0, the result would come back negative as the values would range from 382.14 to 389.86. For high thermal conductivity materials like copper, small changes in the value used for the thermal conductivity will only have a small change on the predicted temperature rise. Hence the impact of this is small. At the other end of the scale, for encapsulant materials, glues, thermal interface materials, etc. which have a much lower thermal conductivity the impact will be greater. However, the properties of these materials are known to a much lower level of certainty, so the values used in the model are likely to be less precise.

Additionally or alternatively, the operation 320 may further comprise using the data variation unit 220 to vary two or more parameters in the first thermal model such that the effects on thermal properties are cancelled out. In some cases, for example for thermally thin materials like die attach layers, solder layers, etc. for which the heat transfer is primarily through the plane of the material, it would be possible to obfuscate the data such that the changes made to the objects thickness and thermal conductivity are matched, preserving the ratio of thermal conductivity to thickness. If the thickness is increased by say 10%, for example, the thermal conductivity would also be increased by 10%. The original product of volume times density times specific heat capacity (V*ρ*Cp) can be maintained if either the material's density or heat capacity would be reduce by 10% to ensure the same thermal mass.

The operation 320 may still further comprise recording original data. Various approaches may be employed. For example, a unique string be used for each object, material, etc. would be to record the obfuscated data in a comma-separated values (CSV) file. An example of the format might be:

Original_Model_Name
. . .
Obfuscated_Data_Name, Original_Data_Name, Information_Stored_In_Notes
. . .

The CSV file might be stored as Obfuscated_Model_Name.csv so that within the disclosing company an obfuscated model can be traced back to the data it originally contained If the obfuscated model does not contain unique names for the obfuscated objects, materials, etc. then the thermal model obfuscation tool 200 may record the position of the object in the model's geometry tree, and the position of the material in the model's material library; or record any unique identifier for the object that is not visible to the user. The obfuscated model should therefore give identical results to the original model, and this could be a logical test to carry out before the model is disclosed, as would reversing the process to ensure that the original model is recovered.

One use of this would be to be able to accept models back through the supply chain in the opposite direction to that supporting the product creation process, for example to better support customers by checking that no data values that affect the simulation result have been changed since the obfuscated model was first made available.

One approach would be to receive back an obfuscated model, convert it back into a copy of the original model by reversing the obfuscation process, as the disclosing party has retained both the original model and the obfuscation mapping between obfuscated values and original values. Determining whether the obfuscated model has been damaged in some way is then a simple matter of checking for differences between the files.

The thermal model received by the thermal model obfuscation tool 200 may contain information about what should be retained in the operation 320. A delimiting character may be inserted at the beginning of the line, such as a # like a comment line within a source file for this purpose. Different delimiters could be used to retain just that data, or in the case of an assembly, retain all the information below the assembly including subassemblies. Table 2 illustrates some examples.

TABLE 2

| Description of object or Assembly in model | Object name in original model | Example of obfuscated name | Obfuscation |
|---|---|---|---|
| Silicon die representing one of the cores in a CPU | #CPU Core 1 | CPU Core 1 | Object name not obfuscated due to presence of leading # character (# optionally removed during obfuscation process) |
| Assembly representing several cores within a CPU | $CPU Cores | CPU Cores | Assembly name, and names of any sub-assemblies and objects not obfuscated due to presence of leading $ character ($ character optionally removed during obfuscation process) |

Alternatively, where the software supports the inclusion of textual notes for an object, these notes may be used to indicate how the object name, attached material, surface attributes, etc. are all treated during the obfuscation process.

In operation 330 of the flowchart 300, the thermal model obfuscation tool 200 stores the obfuscated thermal model in output database 255. Optionally, in operation 340, a thermal simulation is performed on a second assembly based on the obfuscated thermal model. Here, the first assembly is a component of the second assembly.

CONCLUSION

Having illustrated and described the principles of the disclosed technology, it will be apparent to those skilled in the art that the disclosed embodiments can be modified in arrangement and detail without departing from such principles. In view of the many possible embodiments to which the principles of the disclosed technologies can be applied, it should be recognized that the illustrated embodiments are only preferred examples of the technologies and should not be taken as limiting the scope of the disclosed technology. Rather, the scope of the disclosed technology is defined by the following claims and their equivalents. We therefore claim as our disclosed technology all that comes within the scope and spirit of these claims.

What is claimed is:

1. A method, executed by at least one processor of a computer, comprising:
receiving a thermal model for a first assembly;
generating an obfuscated thermal model from the thermal model, wherein the generating comprises: replacing name or names associated with one or more objects in the first assembly with obfuscated names, and removing annotations in the thermal model; and
storing the obfuscated thermal model for being used in a thermal simulation of a second assembly, of which the first assembly is a component.

2. The method recited in claim 1, further comprising:
performing the thermal simulation on the second assembly based on the obfuscated thermal model.

3. The method recited in claim 1, further comprising:
storing information of the thermal model and information of the obfuscated thermal model in a cross-referenced way.

4. The method recited in claim 1, wherein the generating further comprises:
varying one or more parameters in the thermal model within a predetermined range.

5. The method recited in claim 1, wherein the generating further comprises:
varying two or more parameters in the thermal model such that effects on thermal properties are cancelled out.

6. The method recited in claim 1, wherein the first assembly is a chip package.

7. One or more non-transitory computer-readable media storing computer-executable instructions for causing one or more processors to perform a method, the method comprising:
receiving a thermal model for a first assembly;
generating an obfuscated thermal model from the thermal model, wherein the generating comprises: replacing name or names associated with one or more objects in the first assembly with obfuscated names, removing annotations in the thermal model; and
storing the obfuscated thermal model for being used in a thermal simulation of a second assembly, of which the first assembly is a component.

8. The one or more non-transitory computer-readable media recited in claim 7, wherein the method further comprises:
performing the thermal simulation on the second assembly based on the obfuscated thermal model.

9. The one or more non-transitory computer-readable media recited in claim 7, wherein the method further comprises:
storing information of the thermal model and information of the obfuscated thermal model in a cross-referenced way.

10. The one or more non-transitory computer-readable media recited in claim 7, wherein the generating further comprises:
varying one or more parameters in the thermal model within a predetermined range.

11. The one or more non-transitory computer-readable media recited in claim 7, wherein the generating further comprises:
varying two or more parameters in the thermal model such that effects on thermal properties are cancelled out.

12. The one or more non-transitory computer-readable media recited in claim 7, wherein the first assembly is a chip package.

13. A system, comprising:
one or more processors, the one or more processors programmed to perform a method, the method comprising:
receiving a thermal model for a first assembly;
generating an obfuscated thermal model from the thermal model, wherein the generating comprises: replacing name or names associated with one or more objects in the first assembly with obfuscated names, removing annotations in the thermal model; and
storing the obfuscated thermal model for being used in a thermal simulation of a second assembly, of which the first assembly is a component.

14. The system recited in claim 13, wherein the method further comprises:
performing the thermal simulation on the second assembly based on the obfuscated thermal model.

15. The system recited in claim 14, wherein the method further comprises:
storing information of the thermal model and information of the obfuscated thermal model in a cross-referenced way.

16. The system recited in claim 14, wherein the generating further comprises:
varying one or more parameters in the thermal model within a predetermined range.

17. The system recited in claim 14, wherein the generating further comprises:
varying two or more parameters in the thermal model such that effects on thermal properties are cancelled out.

* * * * *